United States Patent Office 3,157,717

Patented Nov. 17, 1964

3,157,717
REPAIR OF RELIEF IMAGES

Glen Anthony Thommes, Middletown, N.J., assignor to E. I. du Pont de Nemours and Company, Wilmington, Del., a corporation of Delaware No Drawing. Filed Feb. 2, 1961, Ser. No. 86,590
6 Claims. (Cl. 264—36)

This invention relates to the repair of relief images. More particularly, it relates to a process for restoring compressed and deformed relief images of photopolymerized elements to their normal configuration.

Solid photopolymerizable compositions as described in U.S. Patents Plambeck 2,760,863 and 2,791,504, Martin et al. 2,927,022 and Munger 2,923,673 are becoming of increased importance in the manufacture of relief printing plates or elements. These compositions, in addition to other photopolymerizable compositions to be described later, contain inter alia, an organic polymer binding material, an addition polymerizable ethylenically unsaturated compound, e.g., vinylidene and vinyl monomers, preferably of the acrylic or alkacrylic ester type, and an addition polymerization initiator activatable by actinic radiation. The photopolymerizable compositions are formed into a layer of uniform thickness, superposed and are adhered to a suitable base support to form a photopolymerizable element. The photopolymerizable layer is then exposed to actinic radiation through an image-bearing transparency, consisting solely of substantially opaque and substantially transparent areas, until substantial addition polymerization takes place in the exposed image areas without substantial addition polymerization in the unexposed image areas. The unexposed portions of said photopolymerizable layer are removed with a solvent for the unpolymerized material leaving relief images of the text and halftones of the transparency which are suitable for direct use as a printing plate, especially for letter-press work or dry offset. The printing reliefs so obtained have excellent wear characteristics, comparable to copper-faced electrotypes which are much more expensive and far more difficult to prepare. The printing plates may be flat or they may be curved to fit various type printing presses. In addition to printing, printing reliefs are useful in the preparation of matrices for stereotypes. Stereotype mats are prepared by pressing soft paper against the printing relief with pressures of about 3000 to 7000 pounds per square inch. A female matrix is formed in the paper which serves as a mold into which molten type metal is poured. After the metal has hardened, the paper mat is stripped off to give a duplicate of the original plate.

Under normal printing conditions, including inking, considerable pressure is exerted on the surface of relief images. It is well known that damage is caused to relief printing plates by press batters, excessive printing pressures, careless handling and normal wear. Compression damage by so-called press batters can be caused when foreign matter becomes lodged between the relief image surface and the inking roller or the surface to be printed. Compression, deformation damage and abrasion are also caused to the relief images used in the preparation of stereotype mats by the matting material or by foreign matter between the mat and the relief image surface. Damage of the types described above occurs with the prior art metal plates. Such plates, however, are usually non-repairable.

An object of this invention is to provide a simple and practical process for repairing solid, addition polymerized relief images. Another object is to provide a process whereby compressed and deformed relief images are restored to their original size and shape. Still another object is to provide a process which utilizes simple, readily available equipment. Still further objects will be apparent from the following detailed description.

The above objects are attained by a process for restoring compression-deformed, solid, addition polymerized relief images which comprises treating said compression-deformed relief images with a liquid having a plasticizing action on the relief images and heating said relief images until they are restored to essentially their original shape and size. Generally, the liquid having the plasticizing action is applied to the relief images prior to the application of heat. The liquid and heat, however, may be applied simultaneously or the application of heat may occur prior to the treatment with the liquid provided the heat is continued while the liquid is in contact with the surface of the relief images. Repeated applications of heat and liquid can also be used to restore the shape of relief images.

The particular liquid used in the treatment is dependent on the composition of the addition polymerized material. The liquid must not have a deleterious effect on the polymerized composition, and, in addition, must have a plasticizing action on the composition. Among the useful treatment liquids are water; ketones, e.g., acetone, methylethyl ketone; alcohols, e.g., methyl alcohol, ethyl alcohol, propyl alcohol, isopropyl alcohol; esters, e.g., methyl acetate, ethyl acetate; ethers, e.g., methyl ether, ethyl ether, methyl cellosolve, ethyl cellosolve, dioxane; organic acids, e.g., glacial acetic acid, propionic acid; and dilute solutions of bases, e.g., sodium hydroxide, potassium hydroxide, ammonium hydroxide. The surface of the compression-deformed image areas need only be moistened with a suitable liquid as described above and heated in the range of about 20° to 150° C. Heat may be applied in several forms, e.g., a circulating current of air, surface contact with a heated element, infrared radiation, etc. With some polymerized compositions, steam is particularly useful.

The amount of heat will depend upon the thickness and composition of the polymer layer and the degree of damage. Where the relief has been greatly compressed in large areas, it will be necessary to apply moisture and heat for a comparatively longer period of time than if compression was slight. In general, for additional-polymerized relief images 30 mils in thickness on aluminum base supports, good repairs can be obtained by applying moisture and heating the damaged area at about 60° C. for from 1 to 30 minutes. Lower temperatures can be used but the period of heat application required will be longer for complete recovery of the deformed areas.

Polymerizable elements useful for forming addition-polymerized relief images comprise a support and a relief height-forming solid stratum comprising (1) a preformed, compatible, macromolecular polymer-binding agent, (2) a non-gaseous, addition polymerizable ethylenically unsaturated compound containing at least one terminal ethylenic group, having a molecular weight of less than 1500, a boiling point above 100° C. at normal atmospheric pressure and being capable of forming a high polymer by free-radical initiated, chain-propagating addition polymerization in the presence of an addition polymerization initiator therefor activatable by actinic radiation and (3) from 0.0001 to 10% or more, by weight, of the stratum of such an initiator. In general, components (1), (2) and (3) are present in amounts from 40 to 90 parts, 10 to 60 parts and 0.0001 to 10 parts by weight, respectively.

Suitable addition polymerizable compositions are disclosed in the following patents: Plambeck U.S. 2,760,-863 and U.S. 2,791,504; Martin U.S. 2,892,716, U.S. 2,902,365, U.S. 2,927,023 and US. 2,929,710; Martin and Barney U.S. 2,927,022; Barney U.S. 2,893,868 and U.S. 2,948,611; Munger U.S. 2,923,673; Notley U.S. 2,951,758 and British patent specifications 826,272, 827,-512 and 835,849. In addition, a composition comprising cellulose acetate, triethylene glycol diacrylate, anthraquinone and p-methoxyphenol can be used.

The above-disclosed polymerizable compositions are adhered by means of a suitable adhesive layer to a base support. Suitable adhesive compositions are disclosed in the above patents. Adhesives such as disclosed in assignee's Belgium Patent 580,820 are particularly useful.

The base supports may be flexible or rigid and may be composed of aluminum, steel or other suitable metal. The supports also can be made of various film-forming resins or polymers. Suitable supports are disclosed in Plambeck U.S. 2,760,863, column 5, lines 14 to 33. The support or adhesive layer may have in or on its surface an antihalation layer as disclosed in the aforesaid Plambeck patent. With transparent or translucent supports, the antihalation material may be on the rear surface of the photopolymerizable material. When antihalation protection is used, it preferably should be sufficiently absorptive of actinic radiation so that less than 35% of the incident actinic radiation is reflected.

The element is then exposed to a source of actinic radiation through an image-bearing transparency. Suitable radiation sources include carbon arcs, mercury vapor arcs, fluorescent lamps with special ultraviolet radiation emitting phosphors, xenon arc lamps and photographic flood lamps. The unexposed portions of the photopolymerizable layer are removed by solvent treatment, leaving the addition-polymerized relief images. Removal of the unexposed portions can be expedited by brushing or spraying with a solvent for the unpolymerized material. Solvents for particular compositions are disclosed in their respective patents and include water, aqueous alkali solutions and organic solvents.

The relief image elements generally are used for printing or for forming stereotype mats as described above. While in use the relief images may be damaged, i.e., compressed or deformed by press batter or other foreign matter. This invention eliminates such damage, as described in the following examples, which illustrate but are not intended to limit the invention.

*Example I*

A printing plate having relief printing characters and halftone areas was made according to Example I of Munger U.S. 2,923,673 except that the photopolymerizable layer was laminated by a non-reflective adhesive layer to a sheet of aluminum 100 mils thick. The printing plate was used in a conventional manner in a flat bed press to give an excellent reproduction of the images. The image surface was then subjected to press batter by taping wadded paper, twine and paper clips to a sheet and running the printing plate against the sheet to be printed as in normal press operations. A reproduction proof pulled in the press after the press batter step showed that some of the images were damaged and did not print. The plate was then steamed in the halftone areas, and the highly compressed areas were wetted with water and heated with an infrared lamp to about 100° C. for a period of 1 to 30 minutes until microscopic examination indicated complete relaxation and restoration of the damaged areas. The relief printing characters and halftone areas were completely restored and showed no indication of damage. The repaired plate was used in a press run of 10,000 impressions. The repaired areas showed no more wear than areas which had not been damaged originally.

*Example II*

A photopolymerizable composition prepared as described in Example I of Munger U.S. 2,923,673 was used to make a photopolymerized printing plate as described in Example IV of Notley U.S. 2,951,758. The printing plate was used to make 40 stereotype mats by pressing soft paper against the image surface at a pressure of 4000 pounds per square inch. The image surface of the plate was examined after the preparation of each 5 stereotype mats. A thirty-mil diameter period dot after the 40 mats were prepared was compressed and deformed. The dot surface was rounded and not smooth as when first formed. The worn plate was steamed for one minute and dried. All printing areas were restored to their original condition, i.e., as they appeared before making the stereotype mats. The steam-treated plate was then used satisfactorily to make additional mats.

*Example III*

Four printing plates were made as described in Example I. The printing plates were press battered as described in Example I but only in the small text area. The total thickness of each plate was measured before and after press batter damage to determine the amount of compression deformation. These thickness measurements are shown in the following table together with the thickness measurements made after treatment. The four damaged plates were then moistened with acetone, methyl cellosolve, glacial acetic acid and dioxane, respectively, and heated to about 70° C. for about 7 minutes by means of infrared radiation. The plates were then dried and the thickness measured with the following results:

| Plate No. | Total Thickness of Plate Before Deformation, mils | Thickness After Deformation, mils | Plasticizer | Thickness After Treatment, mils |
|---|---|---|---|---|
| 1 | 149 | 142 | Acetone | 144 |
| 2 | 149 | 144 | Methyl Cellosolve | 147 |
| 3 | 149 | 145 | Glacial Acetic Acid | 147 |
| 4 | 149 | 145 | Dioxane | 148 |

It will be readily seen that substantial recovery had taken place. The above operation was repeated to bring the relief characters back to their full height and size.

*Example IV*

A relief printing plate was prepared from the photopolymerizable composition described in Example II, Table III, Item 53, of Martin U.S. 2,927,022 except that the ratio of cellulose acetate/hydrogen glutarate to triethylene glycol dimethacrylate was 68:32. A block printing image of the plate was deformed by applying pressure with a blunt steel rod. A drop of water was placed on the deformed area, and the element was heated for 5 minutes to a temperature of about 70° C. with a 250-watt infrared lamp. After this time, the printing image had completely recovered its original shape. The image-restored plate was used for printing, no image deformation being noted.

*Example V*

A relief printing plate was prepared from a photopolymerizable composition as described in Example I of Martin U.S. 2,902,365. The photopolymerizable composition contained polyvinyl alcohol/polyvinyl acetate/hydrogen maleate and triethylene glycol diacrylate described in Table II, Item 22, of the Martin patent. A relief of the printing plate was deformed as described in Example IV above, was moistened with water and was heated for 5 minutes at 70° C. The deformed area responded very readily to the treatment and fully image fidelity was restored. The image-restored plate was used for printing, no image deformation being noted.

*Example VI*

A relief printing plate containing a linear N-methoxymethyl polyhexamethylene adipamide and glycerol dimethacrylate in a ratio of 2:1 was prepared as described in Example IV of assignee's British patent specification 826,272. A printing image was deformed as described in Example IV above. The deformed image was then moistened with water and heated to a temperature of 90° C. for 15 minutes with a 250-watt infrared lamp. Recovery of the deformed image was observed.

*Example VII*

A relief printing plate containing a linear N-methoxymethyl polyhexamethylene adipamide and magnesium diacrylate in a ratio of 1:1 and 5% glycerol was prepared as described in Example II of assignee's British patent specification 826,272. A printing image of the plate was deformed as described in Example IV above. The deformed image was moistened with water and heated for 15 minutes at 90° C. with a 250-watt infrared lamp. Recovery of the deformed image was observed.

The process of the invention may be repeated on plates which have been previously damaged and subsequently repaired as described in this invention. In fact, the invention may be repeated until the relief characters become broken or otherwise unusable.

The invention is not limited to the repair of relief image printing plates but may be applied to the repair of gravure plates, ornamental plaques, patterns for automatic engraving machines, foundry and other molds, cutting and stamping dyes, relief maps, and for braille surfaces or for any use where addition-polymerizable compositions having a plastic memory are used.

An advantage of the process of the invention is that it offers a simple and positive means of repairing compression deformation damage of layers comprising the polymerizable compositions described in the above references. A further advantage is that the process of the invention, in the case of relief image printing plates, allows the operator to repair compression deformation damage on the printing plates without removing them from the printing press. For example, the damaged area of a curved printing plate in place on the printing press roller can be repaired by moistening the area with a wet cloth and exposing the moistened area to an infrared lamp for at least one minute or longer. The damaged area may also be repaired by the gentle use of a steam jet. A further advantage is that the process of the invention does not require the use of any elaborate or expensive equipment in its application. Other advantages will be apparent to those skilled in the art.

What is claimed is:

1. In a process for restoring compression-deformed relief images made from a photopolymerizable element comprising a support bearing a solid layer of a photopolymerizable composition comprising (1) a preformed, compatible, polymer binding agent, (2) a non-gaseous ethylenically unsaturated compound containing at least one terminal ethylenic group, having a boiling point above 100° C. at normal atmospheric pressure, being capable of forming a high polymer by free-radical initiated, chain-propagating addition polymerization in the presence of an addition polymerization initiator therefor activatable by actinic radiation and (3) from 0.0001 to 10% by weight of the layer of such an initiator which is inactive thermally below 85° C., by exposing it imagewise to actinic radiation, removing the unexposed portions of said photopolymerizable layer with a solvent for the unexposed portion of the layer to form relief images of addition polymer and subsequently subjecting said relief images to a compressive force, the improvement characterized by treating the said compression-deformed relief images with a liquid having a plasticizing action therefor, said liquid having no deleterious effect on the said relief images, and heating the photopolymerized element until said compression-deformed images are restored to essentially their original shape and size.

2. A process as in claim 1 where said plasticizing liquid is glacial acetic acid.

3. A process as in claim 1 where said plasticizing liquid is water.

4. A process as in claim 1 where said plasticizing liquid is acetone.

5. A process as in claim 1 where said plasticizing liquid is methyl cellosolve.

6. A process as in claim 1 where said plasticizing liquid is dioxane.

References Cited in the file of this patent

UNITED STATES PATENTS

| | | |
|---|---|---|
| 2,047,124 | Cutts et al. | July 7, 1936 |
| 2,422,017 | Hunt | June 10, 1947 |
| 2,559,539 | Kelly | July 3, 1951 |
| 2,641,859 | Albert | June 16, 1953 |
| 2,872,349 | Hunn | Feb. 3, 1959 |
| 2,944,294 | Bourbeau et al. | July 12, 1960 |
| 2,971,225 | Woodruff et al. | Feb. 14, 1961 |
| 3,000,057 | Swedlow et al. | Sept. 19, 1961 |